(12) United States Patent
Li et al.

(10) Patent No.: US 6,814,328 B1
(45) Date of Patent: Nov. 9, 2004

(54) SPOOL APPARATUS AND METHOD FOR HARNESSING OPTICAL FIBER TO A CIRCUIT BOARD

(75) Inventors: Hong Li, Carol Stream, IL (US); Kenneth S. Laughlin, Arlington Heights, IL (US); Craig G. Mitchell, South Barrington, IL (US); Thomas C. Ruberto, Palatine, IL (US)

(73) Assignee: UTStarcom, Inc., Alameda, CA (US)

( * ) Notice: Subject to any disclaimer, the term of this patent is extended or adjusted under 35 U.S.C. 154(b) by 0 days.

(21) Appl. No.: 10/027,689

(22) Filed: Dec. 21, 2001

(51) Int. Cl.[7] ............................. B65H 75/44; G02B 6/08
(52) U.S. Cl. .................... 242/400.1; 385/135; 191/12.2
(58) Field of Search ....................... 242/400.1; 191/12.2

(56) References Cited

U.S. PATENT DOCUMENTS

| | | | | |
|---|---|---|---|---|
| 4,722,585 A | * | 2/1988 | Boyer | 385/135 |
| 4,765,708 A | * | 8/1988 | Becker et al. | 385/135 |
| 5,066,149 A | * | 11/1991 | Wheeler et al. | 385/135 |
| 5,724,469 A | * | 3/1998 | Orlando | 385/135 |
| 5,907,654 A | * | 5/1999 | Render et al. | 385/135 |
| 6,208,797 B1 | * | 3/2001 | Vanderhoof et al. | 385/135 |
| 6,481,662 B1 | * | 11/2002 | Kles et al. | 242/400.1 |
| 6,608,957 B2 | * | 8/2003 | Sudo et al. | 385/135 |
| 2002/0181923 A1 | * | 12/2002 | Wojcik | 385/135 |

* cited by examiner

*Primary Examiner*—Sang K. Kim
(74) *Attorney, Agent, or Firm*—Baniak Pine & Gannon

(57) ABSTRACT

An apparatus and method for retaining a length of fiber optic cable to a circuit board includes a spool-shaped retention apparatus. A body portion of the apparatus includes a channel formed about the periphery of the body portion for receiving and retaining a portion of the length of fiber optic cable in an arc having a radius greater than a minimum bend radius of the fiber optic cable. A plurality of legs extend from the body portion, each of the legs is adapted to be received in a mounting opening formed in the PC board. Each of the spaced legs may include a foot portion adapted for securing the body to the circuit board.

18 Claims, 3 Drawing Sheets

SPOOL APPARATUS AND METHOD FOR HARNESSING OPTICAL FIBER TO A CIRCUIT BOARD

FIELD OF THE INVENTION

This invention relates generally to the field of fasteners for printed circuit board applications and, in particular, to a means and method for harnessing or retaining optical fiber to a printed circuit (PC) board or the like.

BACKGROUND OF THE INVENTION

It is conventional to process or route information to and from many types of electronic devices via fiber optic cables, especially when large amounts of data or large numbers of signals need to be transmitted. Typically, the electronic devices include printed circuit boards with various components used to process the signals or perform needed operations. The components may include typical electronic and opto-electronic devices such as transceivers and so on. Typically, one end of a fiber optic cable is fastened to the circuit board by a connector that allows communication with an incoming or external fiber optic cable. A length of fiber optic cable may then extend from the connector to a device attached to the circuit board and thus permit data transmission therebetween.

However, fiber optic cable has physical limitations, notably the bending it can withstand without failure. The limitation on the bending that a fiber optic cable can withstand prior to failure is known as the minimum bend radius. Due to this physical limitation, devices have been created to manage or harness fiber optic cable to a printed circuit board in such a manner as to prevent over bending of the fiber optic cable and to prevent entanglement of the cable with adjacent components or boards, especially during installation of the board. One such harnessing or retaining device is a retaining eye loop. This prior art device resembles a ring mounted upon a post. The post includes an arrow-shaped connector or head portion opposite the ring, which, when inserted through an opening in a circuit board, expands on the far side of the board and holds the retaining device in place. Examples of such snap leg latches are shown in FIGS. 1 and 2 of U.S. Des. Pat. No. 278,143 (see also, U.S. Pat. Nos. 5,281,149, 5,255,159, and 6,058,579).

However, a disadvantage of such a retaining device is the difficulty of insertion of the connector portion, which can damage or break the circuit board. Further, the extent to which the retaining device extends outwardly from the circuit board, front and back, when installed, can increase the effective thickness of the circuit board, interfere with installation and damage adjacent components.

Accordingly, it would be desirable to provide an apparatus and method of providing improved retension of fiber optic cable to a circuit board, or the like, which overcomes the disadvantages described above.

SUMMARY OF THE INVENTION

One aspect of the present invention provides a spool retainer apparatus for providing retention of fiber optic cable to a circuit board. The spool retainer for retaining a length of fiber optic cable to a circuit board includes a spool-shaped body portion. The body portion of the apparatus includes a plurality of spaced legs extending from the body portion, each of the legs is adapted to be received in a mounting opening formed in the PC board. Each of the spaced legs can include a foot portion adapted for securing the body to the circuit board. The spool retainer body includes a cylindrical portion. Each one of a pair of annular flanges is positioned at one end of the cylindrical portion. The spool body portion defines a channel for retaining the fiber optic cable in an arc having a radius greater than a minimum bend radius of the fiber optic cable.

Another aspect of the present invention provides a retaining spool for a PC board for retaining a length of fiber optic cable including a body portion. The body portion includes a channel defined about the periphery thereof for receiving the fiber optic cable in an arc having a radius greater than a minimum bend radius of the fiber optic cable and a plurality of legs extending from the body portion. Each of the legs is adapted to be received in an opening formed in the PC board.

In other aspects of the present invention, the body portion may include a center portion and upper and lower flange portions. The center portion may have the form of a cylinder. The upper and lower flange portions can define the channel with the center portion. The body portion may include a plurality of posts formed on the center portion. The posts may extend in a generally axial direction and may be inserted into corresponding openings formed in the upper and lower flange portions for positioning the flange portions on the center portion. At least one of the lower and upper flange portions may include at least one tab positioned to close the channel for retaining the fiber optic cable therein.

Each of the legs may include a foot portion positioned at the distal end of each the leg being adapted for securing the retaining spool to the PC board. Each of the legs may include a cross piece positioned between the foot portion and the body portion. The legs may extend from the body angled outwardly with respect to the axial direction. The legs may be attached to the lower flange portion at an outer edge thereof. The legs can be attached to the central portion from an inner wall thereof. Each foot may extend at an angle from each leg. Each foot may be formed at an orientation substantially parallel to the plane of the PC board when the retaining spool is affixed thereto. The retaining spool may include four legs. The retaining spool may preferably be made of a resilient material. The resilient material may be metal or plastic.

Another aspect of the present invention provides a PC board and retaining spool assembly for retaining a length of fiber optic cable thereto including a PC board including a plurality of mounting openings and a retaining spool. The retaining spool includes a body portion defining a channel formed thereabout and a plurality of spaced legs attached to the body portion. The legs are positioned for insertion into the mounting openings to secure the retaining spool to the PC board. A length of optic cable is retained in the channel of the retaining spool.

Another aspect of the present invention provides a method of operation of a retention spool that is adapted to be mounted directly to a PC board for retaining a length of fiber optic cable thereto including providing a channel about the periphery of the retention spool, the channel having a radius greater than a minimum bend radius of the fiber optic cable. A plurality of openings is provided through the PC board in a spaced apart configuration. Pressure is applied to a plurality of legs on the retention spool. Each leg is inserted into a corresponding one of the plurality of openings on the PC board. Pressure is released from the plurality of legs to retain the retention spool to the PC board. The length of fiber optic cable is inserted into the channel in the retention spool and the length of fiber optic cable is thus retained to the retention spool.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE PRESENTLY PREFERRED EMBODIMENTS

Figure 1:
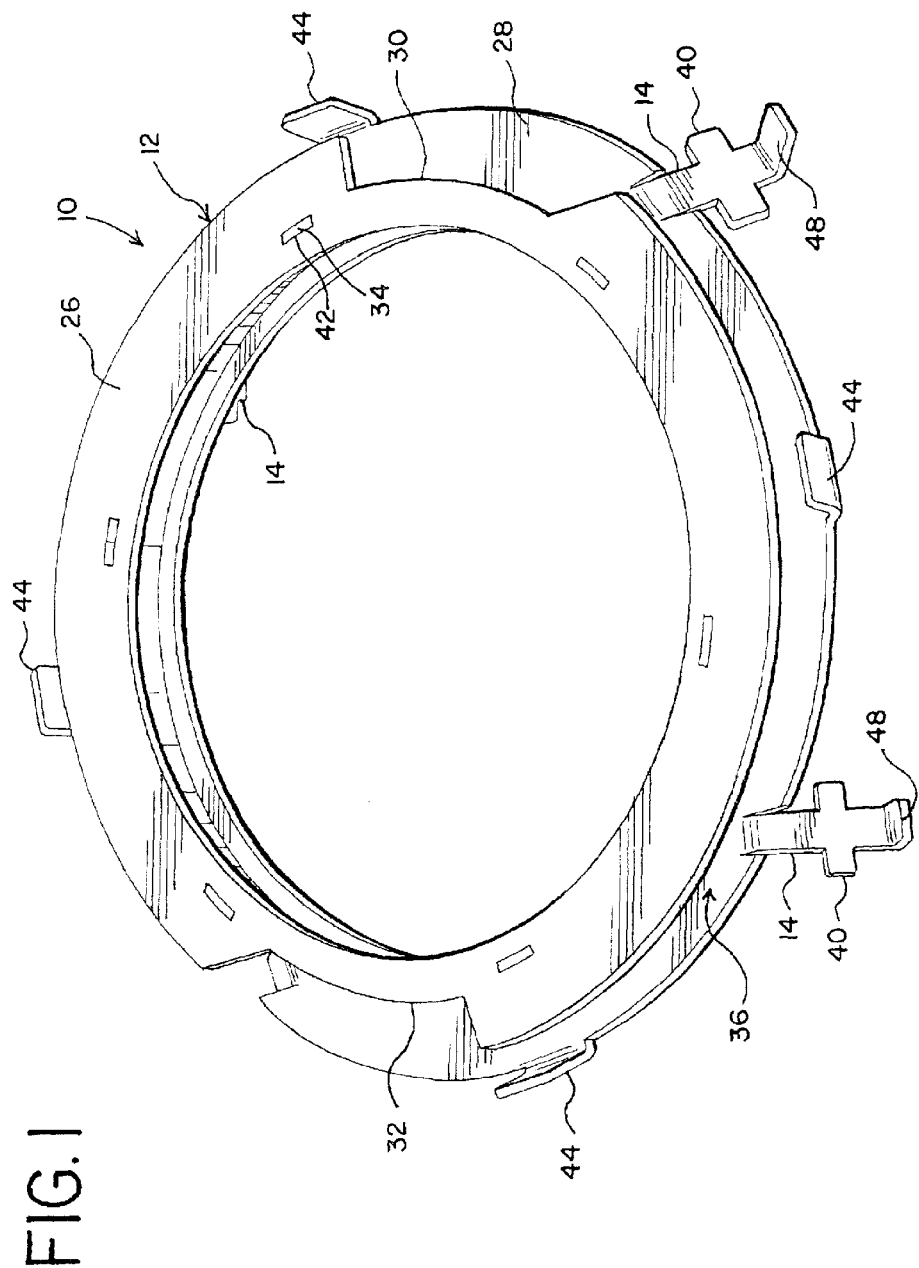
FIG. 1 is a perspective view of one embodiment of a retaining spool that is made in accordance with the invention for retaining fiber optic cable to a PC board.
Figure 2:
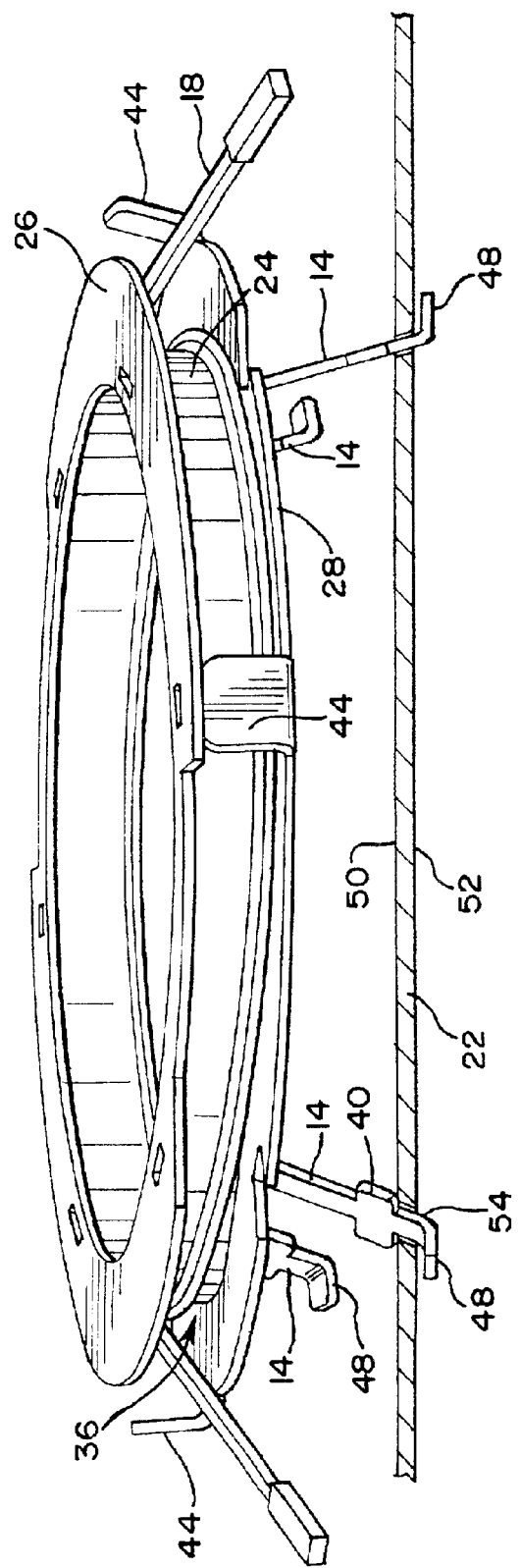
FIG. 2 is a side view of the retaining spool of FIG. 1.

As shown in FIGS. 1-2, one embodiment of an apparatus for holding fiber optic cable to a printed circuit (PC) board, or the like is illustrated generally at 10. The apparatus 10, which may be referred to as a retaining spool, harness, cylindrical assembly or the like, may include a body portion generally indicated at 12. In general, a number of spaced legs 14 may be formed from or attached to the body portion 12 for holding the apparatus 10 to a PC board 22 or the like. The apparatus functions to retain a length of fiber optic cable 18 to an associated PC board.

The retaining spool body portion 12 can be constructed of steel or aluminum or a spring steel material by stamping, extruding, welding, punching, thermoforming or any suitable method. It will be understood that the retaining spool may be formed of any suitable material such as, for example, metal or plastic.

Generally, the body portion 12 of the apparatus comprises a spool shape. Thus, a central portion 24 of the spool shaped body 12 is flanked by outwardly extending annular flange portions 26, 28. The central portion 24 may be preferably cylindrical or other shapes so long as an associated length of fiber optic cable 18 is not forced to assume a smaller than desired radius or is forced to lie along a sharp feature such as a sharp bend or corner. Other suitable non-circular shapes may include elliptical, rounded or other transitional radius shapes.

A plurality of posts or tabs 34 formed may extend from both of the cylinder ends in an axial direction. Preferably, the posts 34 are arranged evenly about the central portion 24. Other arrangements are suitable, for example, which take into account the configuration of components on the board or other design constraints so long as the posts properly support the apparatus. The posts 34 can insert into slots or openings 42 in the upper and lower flanges 26, 28. After positioning the flanges 26, 28 upon the posts 34 of the central portion 24, welds may be applied to the posts 34 and slots 42 to fasten the body portion 12 securely together. Of course, any suitable fabrication, fastening or assembly method may be used to form the body portion 12. After assembly, the body 12 includes a peripheral channel 36 defined about the central portion 24 between flanges 26, 28.

The upper flange portion 26 may have one or more cutout portions 30, 32 to provide a clearance to ease application or wrapping of the fiber optic cable about the periphery of central portion 24.

The lower flange 28 may also include one or more tabs, tab members or features 44. The tabs 44 can be generally rectangular and extend upwardly from the periphery of the lower flange 28. The tabs 44 can be bent over the channel 36 after a length of fiber optic cable 18 is wrapped about the central portion 24 to prevent the cable 18 from unwrapping from the body 12. If the apparatus 10 is formed of a material with spring-like qualities, the tabs 44 may be pulled away from the body 12 and allowed to return into position in order to retain the cable 18. In another embodiment, tabs may be provided in the upper flange 26.

The lower flange 28 further includes a plurality of legs 14. In the embodiment shown, the apparatus 10 includes four legs. It will be understood that three legs will also function to attach the apparatus to a PC board 22 or the like in a stable fashion. The present invention contemplates other numbers of legs depending, for example, on the size of the apparatus 10. The legs 14 may be arranged symmetrically or non-symmetrically depending, for example, on the placement of components on the PC board.

The legs 14 may depend from an outer portion of the lower flange 28. In the alternate, the legs may depend from an inner periphery of the central portion 24 or any other arrangement which functions to securely attach the apparatus 10 to a PC board.

Each leg 14 may include a pair of extensions or a crosspiece 40 formed at approximately right angles to the leg span. The crosspiece 40 may be included to stop the legs 14 at a desired depth in the board 22. Each leg may be bent into position or otherwise formed at an angle from the body 12. It will be understood that the legs 14 may be formed as a part of the apparatus 10 or attached thereto before assembly onto a PC board.

Each leg 14 may include a respective foot 48 formed at the free end of the leg and formed an angle from the legs. Each foot 48 may have a tab, flange, or lip shape or a flattened extending portion or the like. In the illustrated embodiment, each foot 48 extends radially and can be formed by bending or any suitable method. In this manner, as will be explained more fully herein, the legs 14 and feet 48 can hold the retaining spool 10 to a PC board when installed.

In the embodiment shown, the lower flange 28 of the spool apparatus 10 may be formed from a single blank of material. In such a case, the legs 14 and other elements of the lower flange 28 can be formed or defined in one or more pressing, stamping or other suitable operation. Of course, other methods may be used to form the lower flange 28 and other elements of the retaining spool apparatus 10, such as, for example, welding, gluing, thermoforming, molding and so on.

The retaining spool 10 may be mounted on a circuit board 22 shown in FIG. 2. Those skilled in the art will appreciate that the size, shape and configuration of the retaining spool may vary depending upon the particular application as long as the physical bending and other limitations of the cable 18 are not exceeded. The circuit board 22 may preferably be a planar member and may preferably include an upper or first side 50, a lower or back side 52, and a plurality of mounting openings 54 formed therein. The circuit board 22 may preferably be any conventional printed circuit board. The leg portions 14 shown in FIG. 2 extend through the openings 54. The feet 48 may be positioned against the back side 52 of the board 22 and may be held in position by the spring bias of the legs 14. The feet 48 can function to prevent the retaining spool 10 from becoming easily detached from the board 22. As shown in FIG. 2, legs 14 may extend outward slightly angled with respect to the axial direction. The legs 14 may be installed into suitable mounting holes 54 in PC board 22 by hand or machine by first squeezing together and inserting the legs into the mounting holes. Release of the legs 14 permit the legs to spring or flex outwardly and secure the retaining spool apparatus 10 to the PC board 22 by contacting the edges of the board openings 54. Insertion of the legs 14 through the holes causes insertion of the feet 48 into a position extending below the PC board surface. An upper surface of each foot 48 is positioned co-planar with the underside 52 of the PC board. Releasing the legs 14 causes the feet 48 to come into contact with the underside 52 of the PC board 22 and prevent the retaining spool 10 from becoming detached and removed therefrom.

Figure 3:
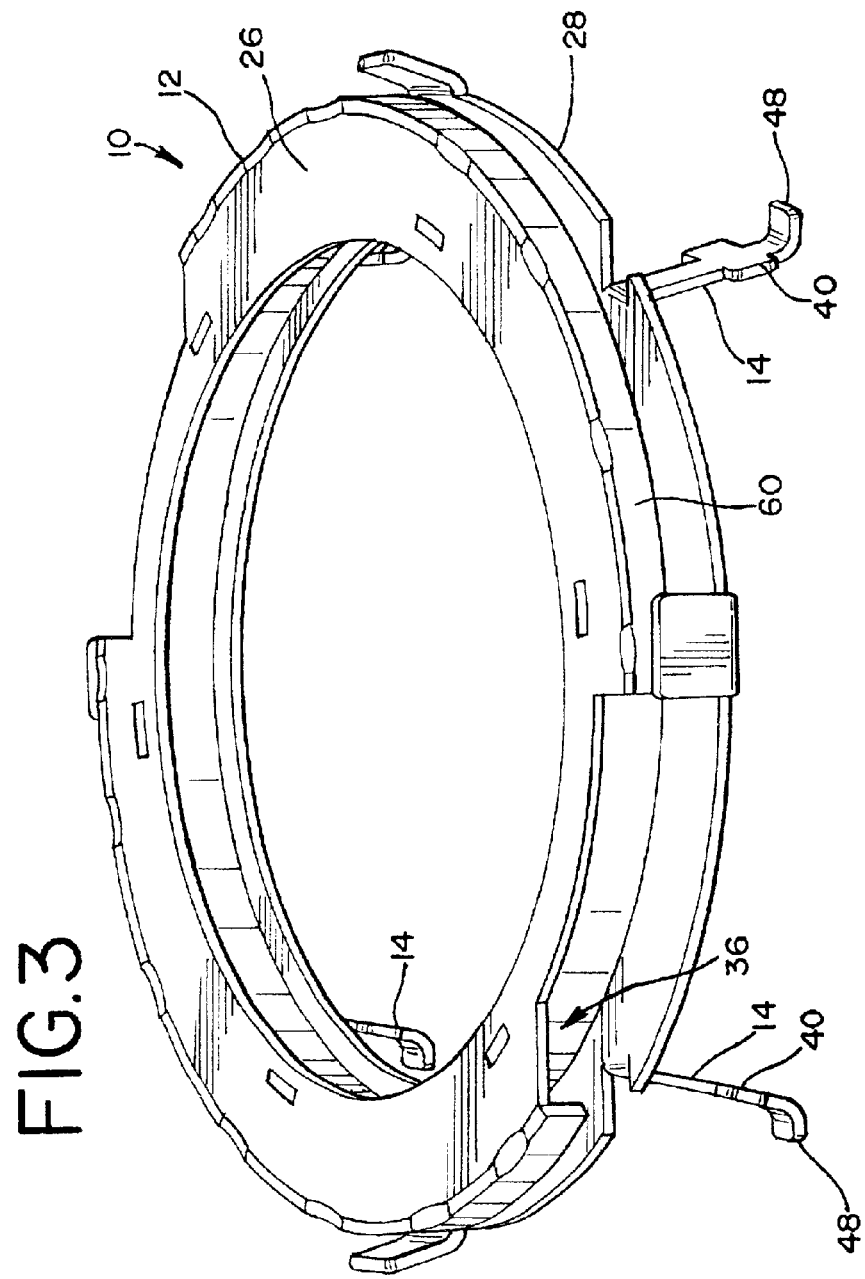
FIG. 3 is a perspective view of another embodiment of a retaining spool made in accordance with the invention.

Referring to FIG. 3, another embodiment of the present invention is illustrated. The elements of the embodiment shown in FIGS. 1–2 that are the same as the elements in the embodiment shown in FIG. 3 are identified with the same reference characters. Retaining spool 10 includes body 12, which may include upper and lower flanges 26, 28. A plurality of legs 14 may be formed from lower flange 28. Each leg may include a crosspiece 40 and foot portion 48. The upper flange 26 can include a cylindrical extension 60, which depends from the outer periphery of the upper flange to close or narrow the opening to the channel 36. In this manner, the apparatus 10 can retain optic fiber (not shown) of a relatively narrow diameter.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A retaining spool for a PC board for retaining a length of fiber optic cable comprising:

a body portion, the body portion including a channel formed about the periphery thereof for receiving the fiber optic cable in an arc having a radius greater than a minimum bend radius of the fiber optic cable wherein the body portion includes a center portion and upper and lower flange portions and wherein the body portion includes a plurality of posts formed on the center portion, the posts being inserted into corresponding openings formed in the upper and lower flange portions for positioning the flange portions on the center portion; and a plurality of legs extending from the body portion, each of the legs sized and shaped to be received in an opening formed in the PC board and to be in contact with a back side of the PC board, for securing the retaining spool to the PC board.

2. The retaining spool of claim 1 wherein the center portion is cylindrical.

3. The retaining spool of claim 1 wherein the upper and lower flange portions define the channel with the center portion.

4. The retaining spool of claim 1 wherein at least one of the lower and upper flange portions includes at least one tab positioned to close the channel for retaining the fiber optic cable therein.

5. The retaining spool of claim 1 wherein each of the legs includes a foot portion formed at a distal end of each leg, the foot portion adapted for securing the retaining spool to the PC board.

6. The retaining spool of claim 5 wherein each of the legs includes a cross piece positioned between the foot portion and the body portion.

7. The retaining spool of claim 5 wherein each foot extends at an angle from each the leg.

8. The retaining spool of claim 5 wherein each foot is formed at an orientation substantially parallel to the plane of the PC board when the retaining spool is affixed thereto.

9. The retaining spool of claim 1 wherein the legs extend from the body angled outwardly.

10. The retaining spool of claim 1 wherein the legs are attached to the lower flange portion at an outer edge thereof.

11. The retaining spool of claim 1 wherein the legs are attached to the central portion from an inner wall thereof.

12. The retaining spool of claim 1 wherein the retaining spool includes four legs.

13. The retaining spool of claim 1 wherein the retaining spool is made of a resilient material.

14. The retaining spool of claim 13 wherein the resilient material is one of metal and plastic.

15. A PC board and retaining spool assembly for retaining a length of fiber optic cable thereto, comprising:

a PC board including a plurality of mounting openings;

a retaining spool, the retaining spool including a body portion defining a channel thereabout wherein the body portion includes a center portion and upper and lower flange portions and wherein the body portion includes a plurality of posts formed on the center portion, the posts being inserted into corresponding openings formed in the upper and lower flange portions for positioning the flange portions on the center portion, the body portion defining further a plurality of spaced legs attached to the body portion, the legs being positioned in the mounting openings and in contact with a back side of the PC board to secure the retaining spool to the PC board; and a length of optic cable retained in the channel of the retaining spool.

16. A method of operation of a retention spool adapted to be mounted directly to a PC board for retaining a length of fiber optic cable thereto, comprising:

providing a channel about the periphery of the retention spool, the channel having a radius greater than a minimum bend radius of the fiber optic cable;

providing a plurality of openings through the PC board in a spaced apart configuration;

applying inward pressure to a plurality of legs on the retention spool;

inserting each the leg into a corresponding one of the plurality of openings on the PC board;

releasing the inward pressure from the plurality of legs to retain the retention spool to the PC board;

inserting the length of fiber optic cable into the channel in the retention spool; and retaining the length of fiber optic cable to the retention spool.

17. The method of claim 16 wherein retaining the length of fiber optic cable to the retention spool includes closing a tab member of the retention spool to close the channel.

18. A retaining spool for a PC board for retaining a length of fiber optic cable comprising:

a body portion, the body portion including a channel formed about the periphery thereof for receiving the fiber optic cable in an arc having a radius greater than a minimum bend radius of the fiber optic cable; and a plurality of legs extending from the body portion, each of the legs sized and shaped to be received in an opening formed in the PC board and to be in contact with a back side of the PC board, for securing the retaining spool to the PC board, wherein each of the legs includes a foot portion formed at a distal end of each leg, the foot portion adapted for securing the retaining spool to the PC board, and wherein each of the legs further includes a cross piece positioned between the foot portion and the body portion.

* * * * *